United States Patent
Pinter

(10) Patent No.: US 8,981,500 B2
(45) Date of Patent: Mar. 17, 2015

(54) METHOD FOR PRODUCING AN OPTICAL WINDOW DEVICE FOR A MEMS DEVICE

(71) Applicant: Stefan Pinter, Reutlingen (DE)

(72) Inventor: Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/870,750

(22) Filed: Apr. 25, 2013

(65) Prior Publication Data

US 2013/0285169 A1 Oct. 31, 2013

(30) Foreign Application Priority Data

Apr. 25, 2012 (DE) .......... 10 2012 206 858

(51) Int. Cl.
| | | |
|---|---|---|
| *H01L 21/00* | (2006.01) | |
| *H01L 29/84* | (2006.01) | |
| *B81C 1/00* | (2006.01) | |
| *B81B 3/00* | (2006.01) | |

(52) U.S. Cl.
CPC ........... *B81C 1/00134* (2013.01); *B81B 3/0018* (2013.01); *B81C 1/00103* (2013.01); *B81C 1/00317* (2013.01); *B81B 2203/0384* (2013.01)
USPC ............................................ 257/415; 438/50

(58) Field of Classification Search
CPC ......... H01L 29/82; H01L 29/84; H01L 21/02; H01L 21/00
USPC ............ 257/98, 415–420, 432–436, E29.167, 257/E21.515, E23.045, E21.587; 438/50, 438/51, 783, FOR. 119, 52–66
See application file for complete search history.

(56) References Cited

U.S. PATENT DOCUMENTS

| | | | |
|---|---|---|---|
| 2001/0022382 A1* | 9/2001 | Shook ........................... | 257/415 |
| 2003/0079547 A1* | 5/2003 | Baek ............................... | 73/716 |
| 2006/0067648 A1* | 3/2006 | Chui et al. ..................... | 385/147 |
| 2007/0024549 A1* | 2/2007 | Choi et al. ...................... | 345/84 |
| 2008/0003710 A1* | 1/2008 | Kogut et al. .................... | 438/52 |
| 2008/0085439 A1* | 4/2008 | Hilliard .......................... | 429/30 |
| 2008/0158645 A1* | 7/2008 | Chiang ........................... | 359/290 |
| 2009/0074955 A1* | 3/2009 | Rowland ...................... | 427/97.3 |
| 2010/0116531 A1* | 5/2010 | Maier et al. ................... | 174/257 |
| 2010/0330332 A1* | 12/2010 | Quenzer et al. ............... | 428/141 |
| 2012/0206462 A1* | 8/2012 | Londergan et al. ........... | 345/501 |
| 2013/0062710 A1* | 3/2013 | Dehe .............................. | 257/415 |
| 2013/0101790 A1* | 4/2013 | Okafuji et al. ................ | 428/141 |

FOREIGN PATENT DOCUMENTS

| | | |
|---|---|---|
| DE | 10 2008 012 384 | 9/2009 |
| DE | 10 2009 045 541 | 4/2011 |
| EP | 1 688 776 | 8/2006 |
| JP | 2011-232522 | * 10/2011 |
| KR | 2010133136 A | * 12/2010 |

* cited by examiner

*Primary Examiner* — Julio J Maldonado
*Assistant Examiner* — Sheikh Maruf
(74) *Attorney, Agent, or Firm* — Kenyon & Kenyon LLP

(57) ABSTRACT

A method for producing an optical window device for a MEMS device, including applying a layer made of a transparent material onto a substrate having a recess, and deforming the layer so that it is folded and the deformed area of the layer forms an optical window.

10 Claims, 22 Drawing Sheets

METHOD FOR PRODUCING AN OPTICAL WINDOW DEVICE FOR A MEMS DEVICE

CROSS REFERENCE

The present application claims the benefit under 35 U.S.C. §119 of German Patent Application No. DE 102012206858.9 filed on Apr. 25, 2012, which is expressly incorporated herein by reference in its entirety.

FIELD

The present invention relates to a method for producing an optical window device for a MEMS device.

BACKGROUND INFORMATION

In order to protect from damaging outer physical or chemical effects, it has been established that MEMS components (micro-(electro)-mechanical components should be encapsulated using a protective wafer, which may have cavities and through holes, in an appropriate wafer composite. It is usual to align the protective wafer on the wafer having the MEMS patterns, and to join them by established techniques, such as anodic bonding or seal glass bonding.

For optical MEMS components, in addition to the requirements described, on the cap wafer a transparent window over the cavity, having a high optical quality, is regularly required. A method for its production is described in German Patent Application No. DE 10 2009 045 541 A1. For the purpose of reducing interfering reflections at the border surfaces of the optically transparent window, thin anti-reflex coatings are applied onto such windows or these are inclined with respect to the MEMS component.

Inclined optical windows for occasional chips are described in European Patent No. EP 1 688 776 A1. Inclined windows especially for the design of wafers made of several layers are described in U.S. Published Patent Application No. 2007 0024549, and their production is explained. German Patent Application No. DE 10 2008 012 384 A 1 describes a cover for encapsulating microsystems, which includes a slantwise optical window, as well as a method for its production.

SUMMARY

The present invention provides an example method for producing an optical window device for a MEMS device, having a first step of applying a layer of a transparent material onto a substrate having a recess, and a second step of deforming the layer, so that it is folded, and the deformed region of the layer forms an optical window.

The present invention provides a cost-effective production method for a window device in optical quality for a MEMS device. The example method ensures the protection of the optical window from scratches and foreign particles during further processing. The example method is suitable for mass production. The example method offers the possibility of limiting the window patterning and to provide the window areas with a nanopatterned surface.

The window is able to be produced and used hermetically sealed.

Further features and advantages of specific embodiments of the present invention are described below with reference to the figures.

DETAILED DESCRIPTION OF EXAMPLE EMBODIMENTS

In the figures, identical reference symbols denote identical or functionally equivalent elements.

Figure 1A:
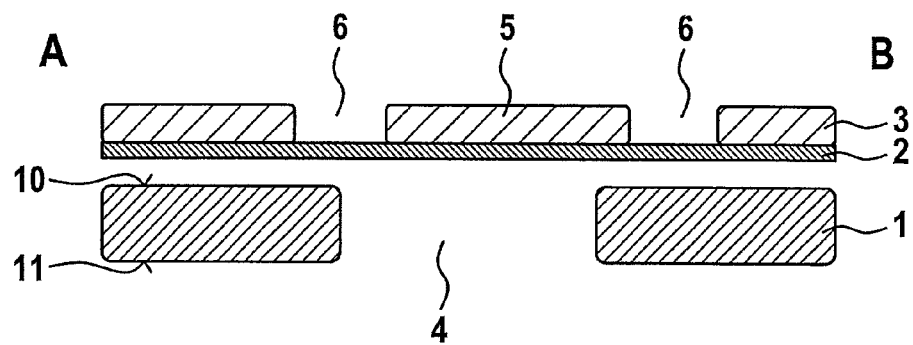
FIGS. 1*a*)-*d*) show schematic cross sectional views along line A-B in FIG. 2, to explain a production method of an optical window device according to a first specific embodiment of the present invention.
Figure 2:
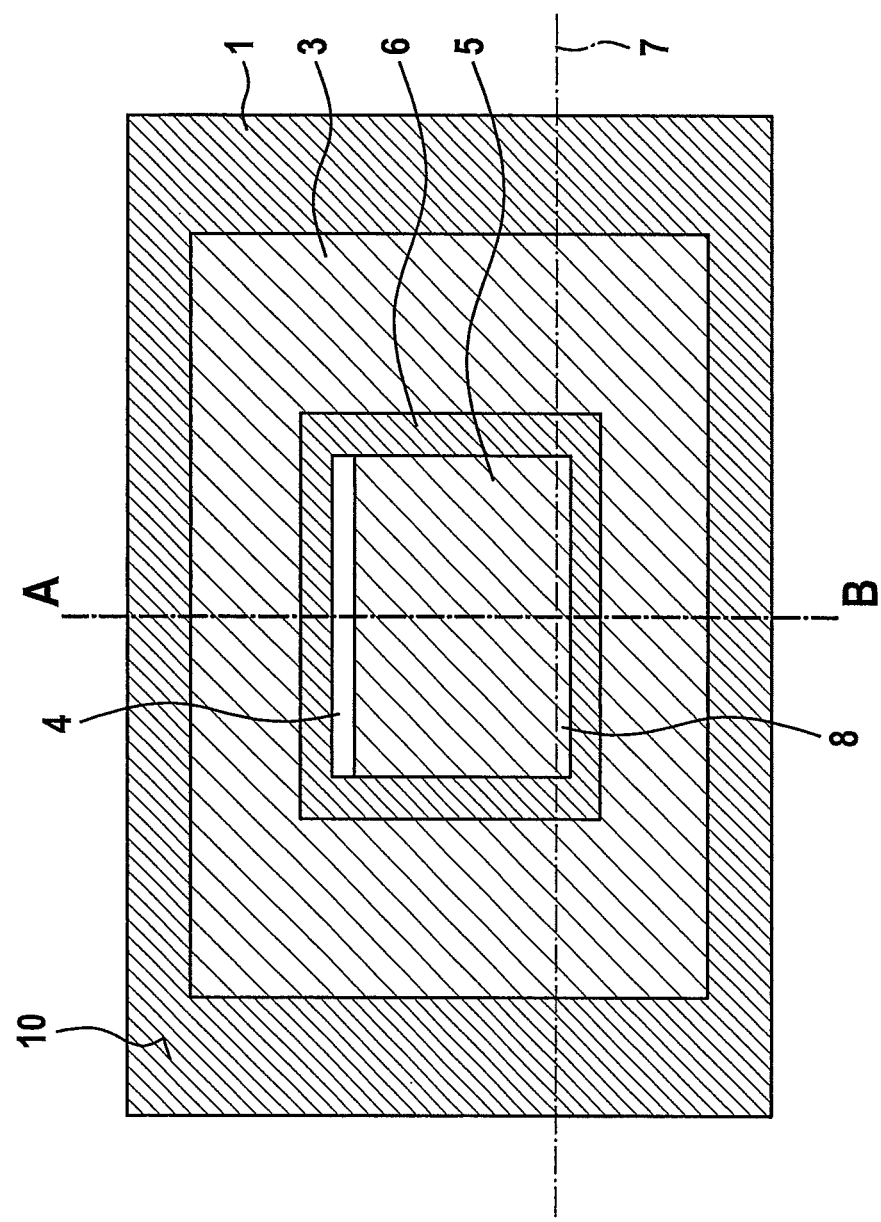
FIG. 2 shows a schematic top view to explain a production method of an optical window device according the first specific embodiment of the present invention.

FIGS. 1*a*)-*d*) are schematic cross-sectional views along line A-B in FIG. 2, to explain an example production method of an optical window device according to a first specific embodiment of the present invention, and FIG. 2 is a schematic top view to explain a production method of an optical window device according to the first specific embodiment of the present invention.

In FIGS. 1*a*)-*d*) and FIG. 2, reference numeral 1 designates a substrate, preferably a silicon substrate, reference numeral 2 a layer of a transparent material, preferably a glass or plastic layer, and reference numeral 3 an auxiliary layer, preferably a silicon layer. Reference numeral 4 designates a through hole opening in substrate 1 and reference numeral 5 designates a displaceable region which is a part of auxiliary layer 3, and is separated from the remaining auxiliary layer 3 by a cavity 6. Reference numeral 7 denotes an axis of inclination via which the displaceable region 5 is able to be rotated into through hole opening 4. Displaceable region 5 shows an overlap 8 with the periphery of through hole opening 4. The upper side of substrate 1 is characterized by reference numeral 10, and its lower side is characterized by reference numeral 11. The window pattern is characterized by F. Layer 2 is not depicted in FIG. 2 for reasons of clarity.

The sequence of the following production steps is not necessarily fixed, and may be undertaken in deviation from that. In a first step, there takes place, according to FIG. 1a), the production of substrate 1, for instance made of silicon, a through hole opening 4 being inserted, for example, by KOH etching or sandblasting or another optional material removal method, such as mechanical drilling, grinding, or by laser. Through hole opening 4 is determined, for example, for the optical access to a micromirror (MOEMS) or for the electrical contacting via the bondlands.

In a second step, as shown in FIG. 1a), a wafer composite is formed, made up of a transparent and thermally deformable layer 2, made of glass or plastic, for instance, and an auxiliary layer 3, which is preferably made of silicon. The wafer composite is produced using methods that are usual in MEMS technology, such as anodic bonding or silicon glass direct bonding. Auxiliary layer 3 may be brought to a desired thickness before or after connection, by grinding or polishing, for example.

In a third step, as shown in FIG. 1a), a displaceable region 5 in auxiliary layer 3 is specified over through hole opening 4, on which the material is maintained. This may be accomplished using a DRIE etching process, for example. Displaceable region 5 is usually smaller than the area of through hole opening 4 in substrate 1. Displaceable region 5 is used to stiffen layer 2 during the deformation following in a further step, and it takes care that optical window pattern F may get an inclination, to be sure, but the evenness of the inclined area remains assured.

Figure 1B:
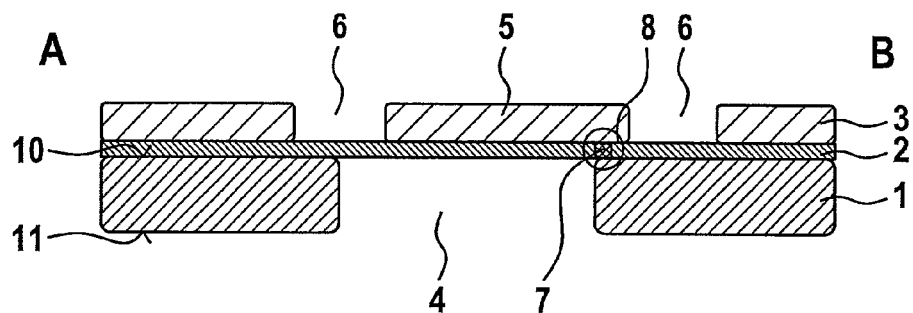

In a fourth step, as shown in FIG. 1b), the system of auxiliary layer 3 and layer 2, as well as substrate 1 are aligned to one another and are connected to one another, by anodic bonding or direct bonding. The patterning of auxiliary layer 3, i.e. the definition of the stiffening, displaceable region 5 over through hole opening 4, may take place before or after the production of this wafer stack, made up of auxiliary layer 3, layer 2 and substrate 1.

Figure 1C:
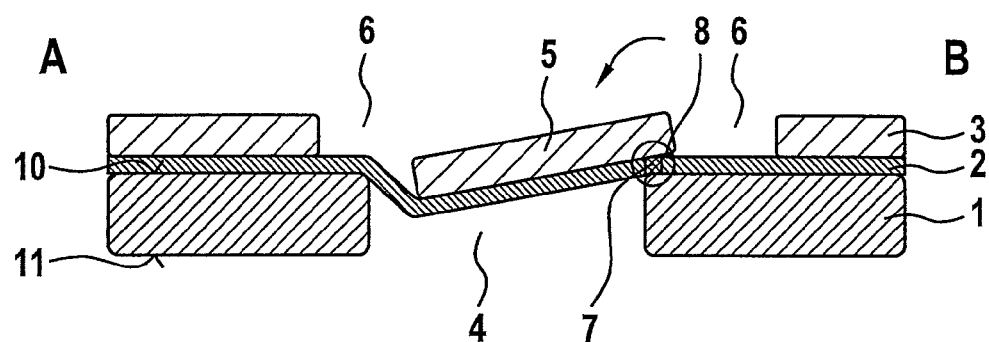

In a fifth step, as shown in FIG. 1c), the wafer stack is chucked in a planar manner from lower side 11 of substrate 1, and is brought to a suitably high temperature, at which layer 2 is able to be deformed plastically. In general, a pressure difference between the two sides of window region F is able to lead to an inclination and/or to a shifting of displaceable region 5. The inclination may also be effected by a mechanical force. Based on the underpressure at through hole opening 4, optical window patterning F is pulled down in the region of displaceable region 5. The desired rotation about axis of inclination 7 is defined in that displaceable region 5 projects out laterally at least on one side or at least at one place over through hole opening 4 at its periphery above substrate 1, and thus demonstrates an overlap 8 with it. Overlap 8 prevents displaceable region 5 on this side from being pulled into through hole opening 4, during the thermal plastic deformation. By a suitably set thickness of auxiliary layer 3, as well as of a suitably set underpressure, one is also able deliberately to produce an arched window patterning F.

Figure 1D:
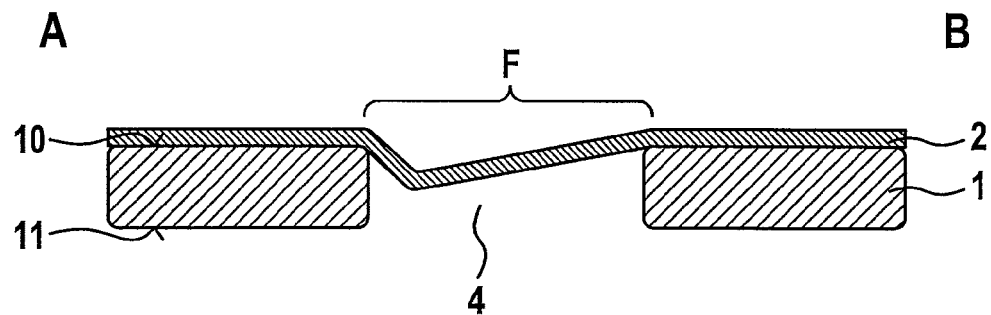

In a sixth step, as shown in FIG. 1d), auxiliary layer 3 is etched away, for instance, by KOH etching. By this etching, layer 2 is not, or only minimally supposed to be etched, so that its optical quality is maintained. In order to minimize the etching time, holes or slots may be inserted in auxiliary layer 3. These patternings increase the etching area and enable an etching attack of other planes, which are etched faster than the original plane. The holes or slots should be suitably designed for the maximization of the etching speed, in their dimensions (length, width and depth). The inserting of these patterns may take place in one process step, together with the production of displaceable region 5.

Figure 3A:
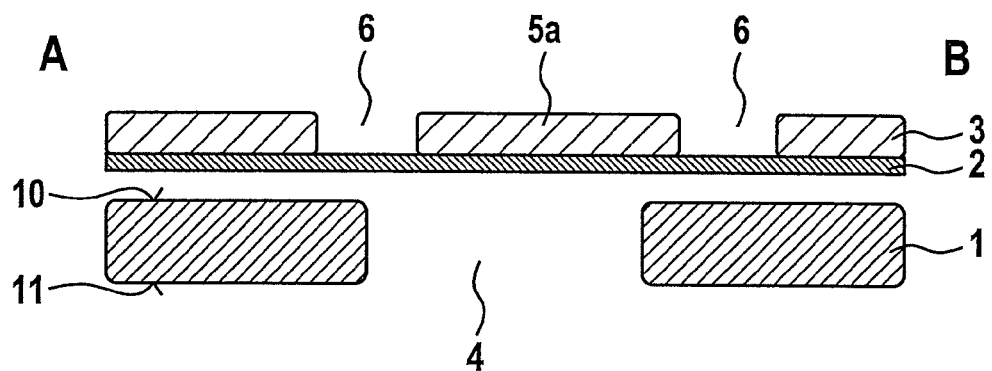
FIGS. 3*a*)-*d*) show schematic cross sectional views along line A-B in FIG. 4, to explain a production method of an optical window device according to a second specific embodiment of the present invention.
Figure 4:
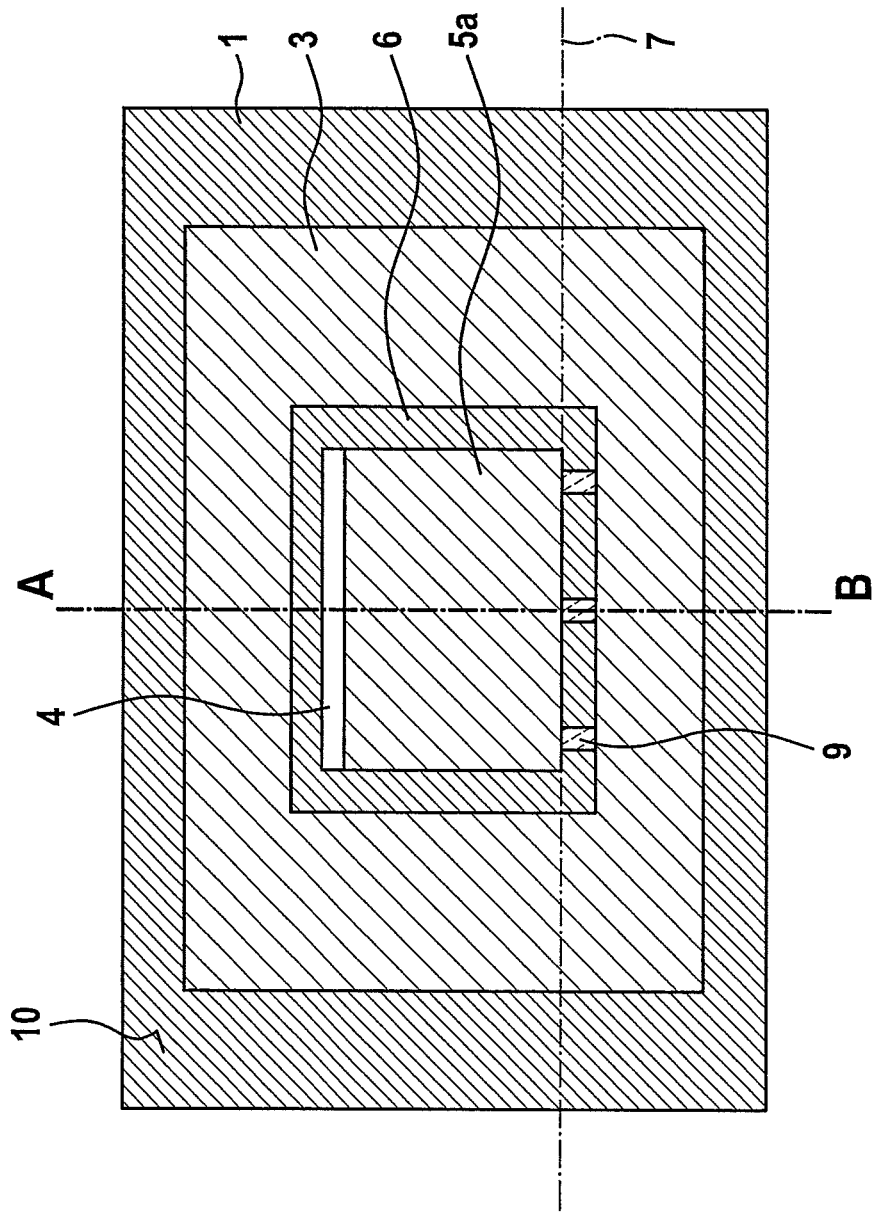
FIG. 4 shows a schematic top view to explain a production method of an optical window device according the second specific embodiment of the present invention.

FIGS. 3a)-d) are schematic cross-sectional views along line A-B in FIG. 4, to explain a production method of an optical window device according to a second specific embodiment of the present invention, and FIG. 4 is a schematic top view to explain a production method of an optical window device according to the second specific embodiment of the present invention.

In FIGS. 3a)-d) and FIG. 4, reference numeral 1 designates a substrate, preferably a silicon substrate, reference numeral 2 a layer of a transparent material, preferably a glass or plastic layer, and reference numeral 3 an auxiliary layer, preferably a silicon layer. Reference numeral 4 designates a through hole opening in substrate 1 and reference numeral 5a designates a displaceable region which is a part of auxiliary layer 3, and is connected to remaining auxiliary layer 3 via at least spring element 9. Reference numeral 6 denotes a cavity. Reference numeral 7 denotes an axis of inclination via which displaceable region 5a is able to be rotated into through hole opening 4. The upper side of substrate 1 is characterized by reference numeral 10, and its lower side is characterized by reference numeral 11. The window pattern is characterized by F. Layer 2 is not depicted in FIG. 4 for reasons of clarity.

Figure 3B:
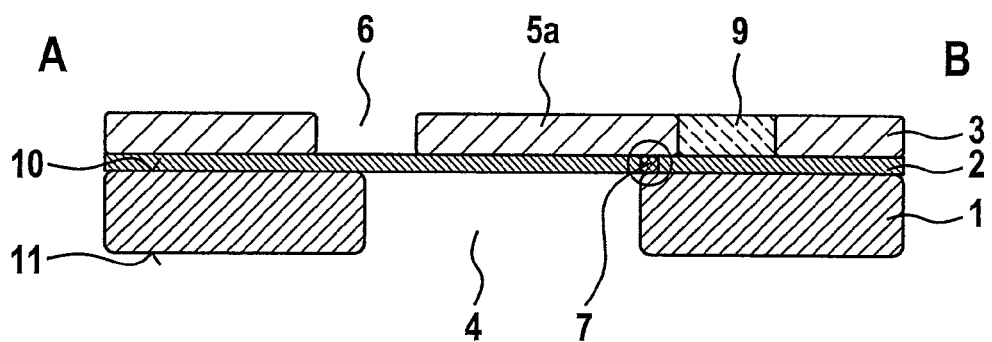
Figure 3C:
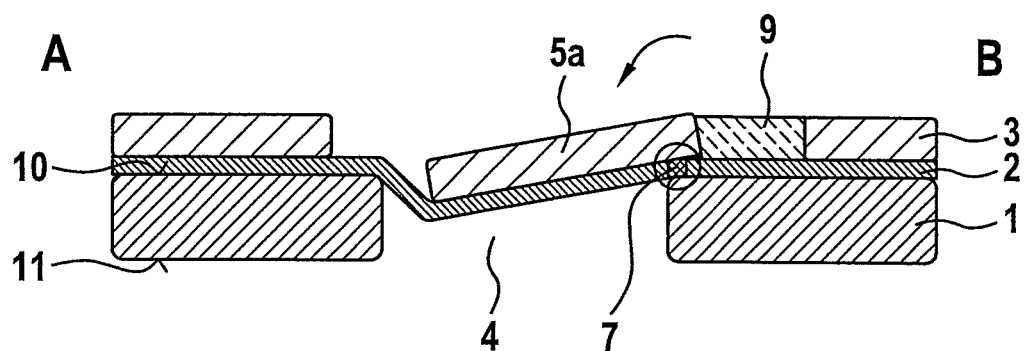
Figure 3D:
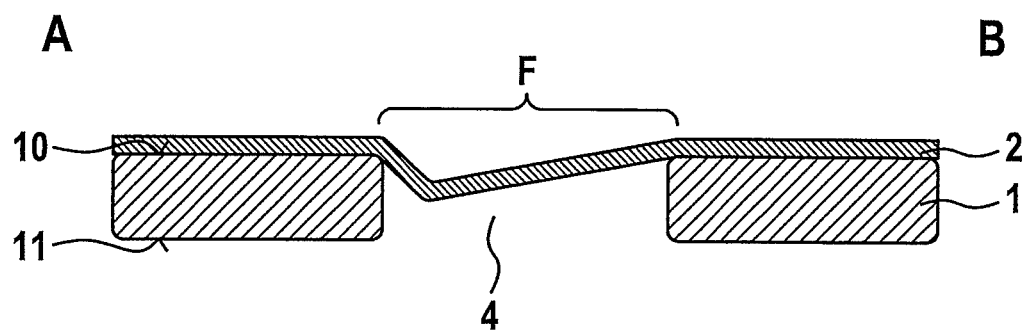

The specific embodiment is analogous to the first specific embodiment shown in FIGS. 1a)-d) and in FIG. 2, the difference being that displaceable region 5a in FIG. 3b)c) is connected to auxiliary layer 3 via at least one spring element 9, and demonstrates no overlap with the periphery of through hole opening 4.

Figure 5A:
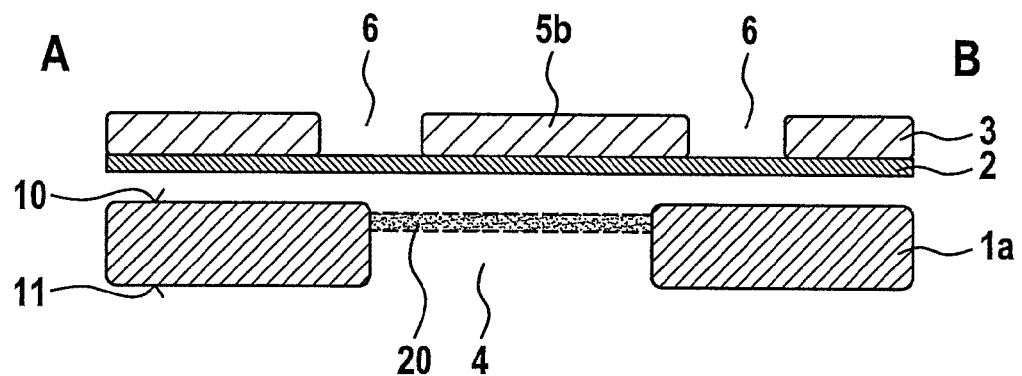
FIGS. 5*a*)-*d*) show schematic cross sectional views along line A-B in FIG. 6, to explain a production method of an optical window device according to a third specific embodiment of the present invention.
Figure 5B:
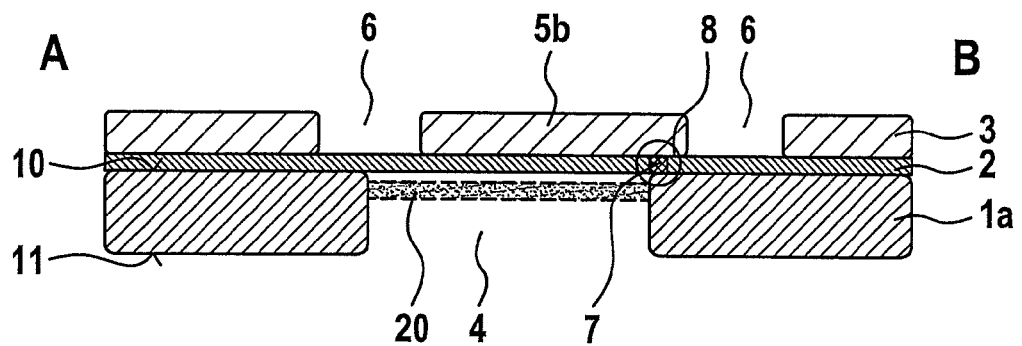
Figure 6:
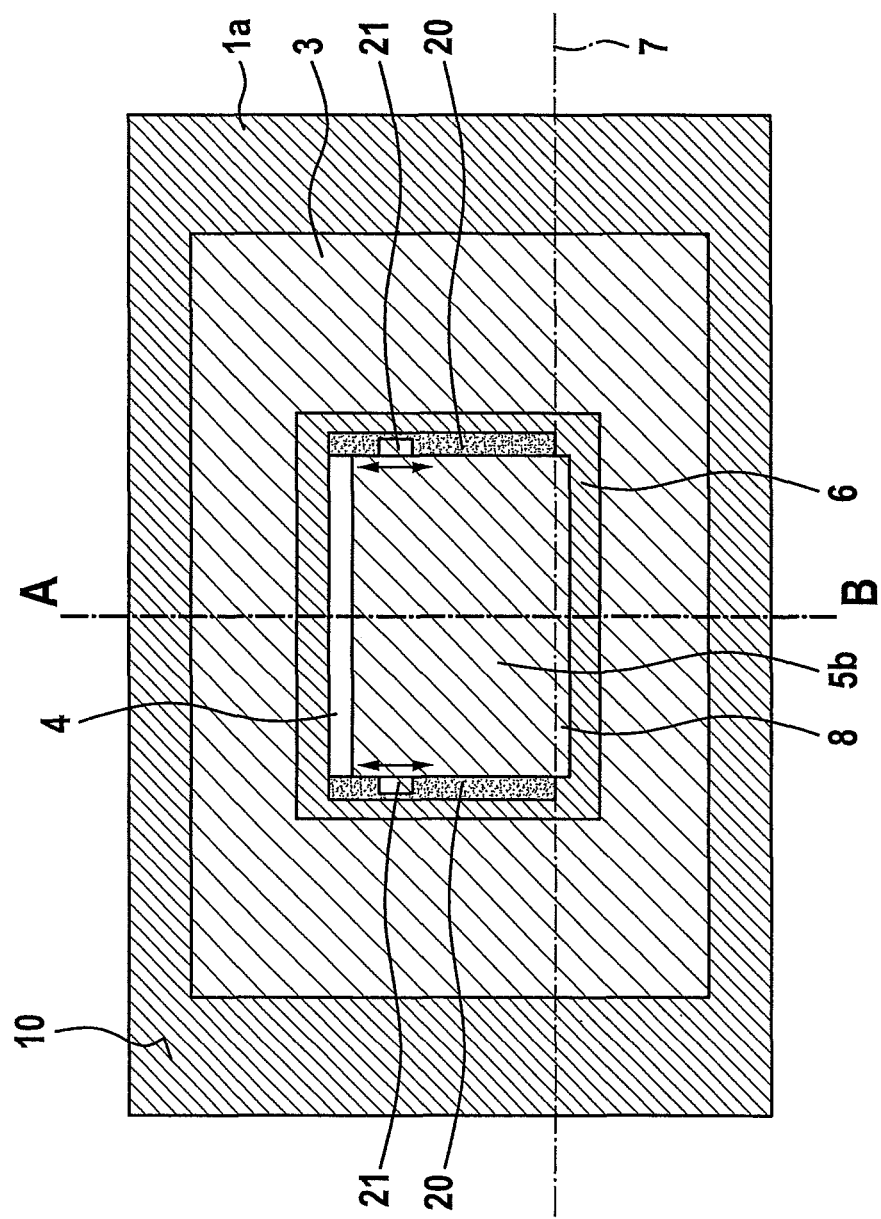
FIG. 6 shows a schematic top view to explain a production method of an optical window device according the third specific embodiment of the present invention.

FIGS. 5a)-d) are schematic cross-sectional views along line A-B in FIG. 6, to explain a production method of an optical window device according to a third specific embodiment of the present invention, and FIG. 6 is a schematic top view to explain a production method of an optical window device according to the third specific embodiment of the present invention.

In FIGS. 5a)-d) and FIG. 6, reference numeral 1a designates a substrate, preferably a silicon substrate, reference numeral 2 a layer of a transparent material, preferably a glass or plastic layer, and reference numeral 3 an auxiliary layer, preferably a silicon layer. Reference numeral 4 designates a through hole opening in substrate 1a and reference numeral 5b designates a displaceable region which is a part of auxiliary layer 3, and is separated from remaining auxiliary layer 3 by a cavity 6. Displaceable region 5b has at least one stop element 21 and chamfers 20 are provided at corresponding sides of through hole opening 4 in substrate 1a. Reference numeral 7 denotes an axis of inclination via which displaceable region 5b is able to be rotated into through hole opening 4. Displaceable region 5b shows an overlap 8 with the periphery of through hole opening 4. In an extreme case, the overlap may also be vanishingly small. The upper side of substrate 1a is characterized by reference numeral 10, and its lower side is characterized by reference numeral 11. The window pattern is characterized by F. Layer 2 is not depicted in FIG. 6 for reasons of clarity.

Figure 5C:
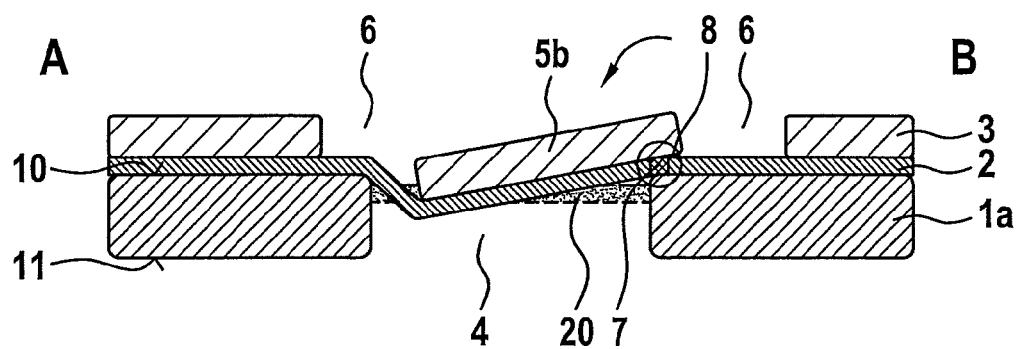
Figure 5D:
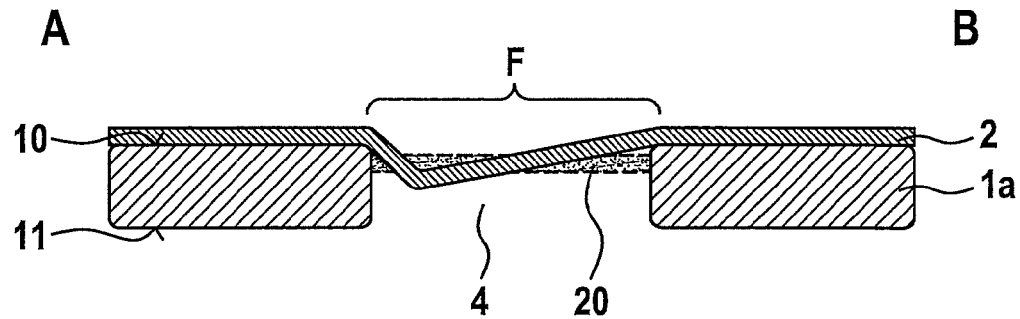

The specific embodiment is analogous to the first specific embodiment shown in FIGS. 1a)-d) and in FIG. 2, for the limitation of the rotation of displaceable region 5b in substrate 1a, a through hole opening 4 being inserted by KOH etching, so that on at least one side of the KOH etching a chamfer 20 is created, as shown in FIG. 5a) and FIG. 6. For the implementation of the mechanical stop of displaceable region 5b on substrate 1a, at least one stop element 21 is applied as shown in FIG. 6 on displaceable region 5b over the at least one chamfer 20. It is thereby ensured that, during heating, displaceable region 5b is only able to rotate so far into through hole opening 4 until the at least one stop element 21 blocks further rotation on corresponding chamfer 20 (FIG. 5c)). The maximum rotation of displaceable region 5b is able to be freely set by the distance of the at least one stop element 21 from axis of inclination 7. The at least one chamfer 20 is also advantageous with respect to the deformation of layer 2, since the deformation is also able to take place on the at least one chamfer 20, and the material therefore has to be cut away only to a lesser extent.

Figure 7A:
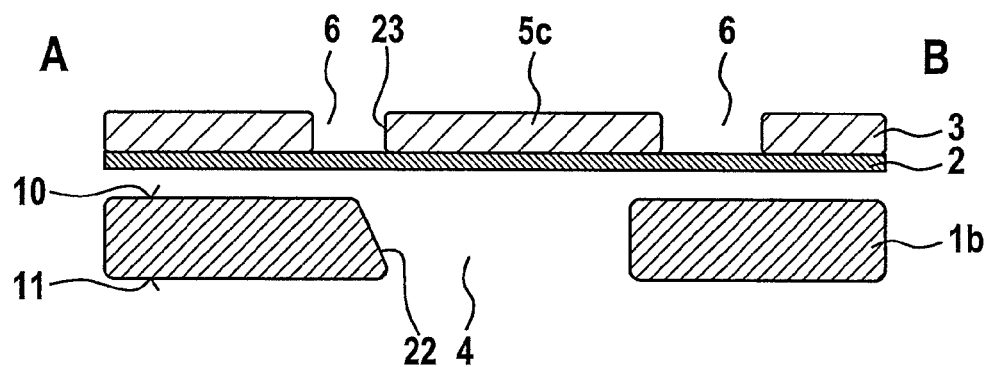
FIGS. 7*a*)-*d*) show schematic cross sectional views along line A-B in FIG. 8, to explain a production method of an optical window device according to a fourth specific embodiment of the present invention.
Figure 7B:
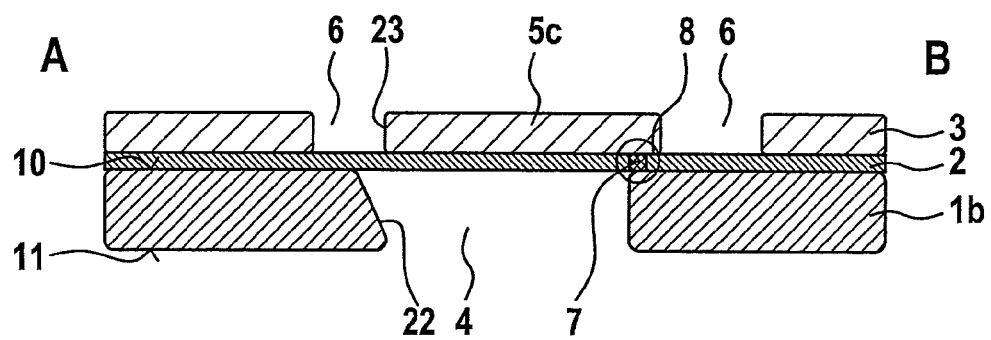
Figure 7C:
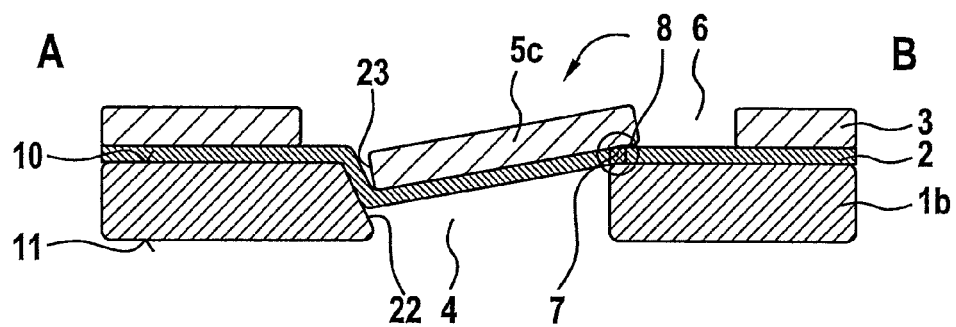
Figure 7D:
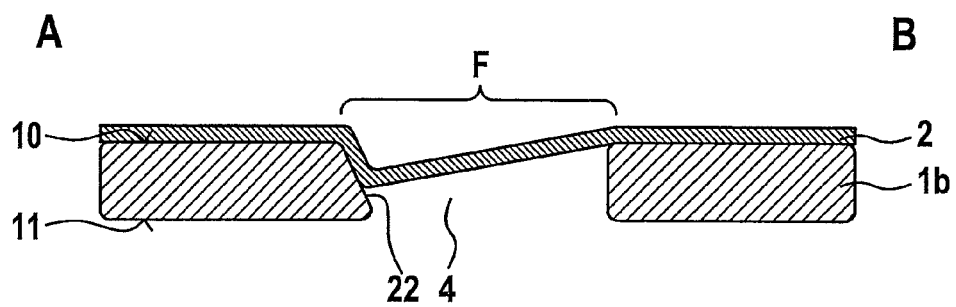
Figure 8:
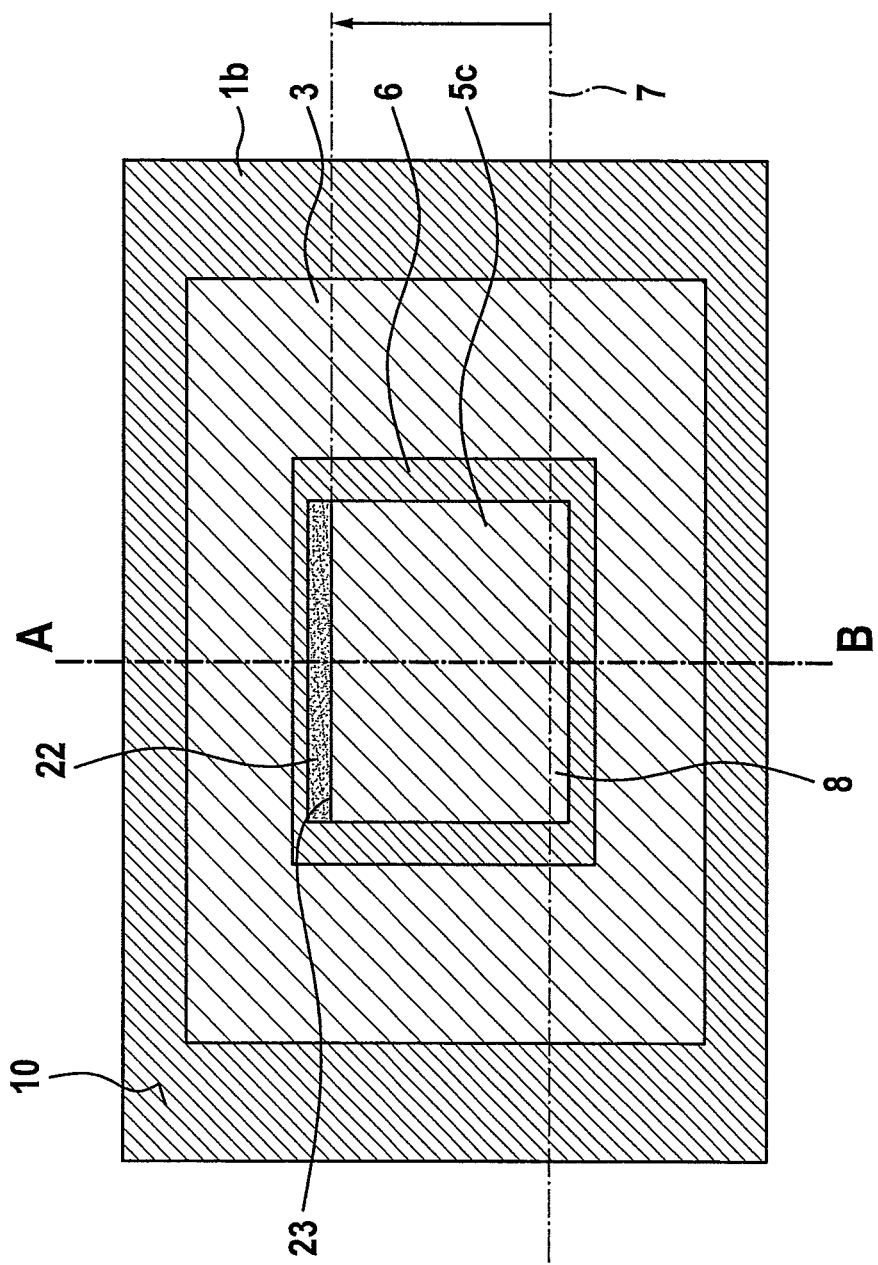
FIG. 8 shows a schematic top view to explain a production method of an optical window device according the fourth specific embodiment of the present invention.

FIGS. 7a)-d) are schematic cross-sectional views along line A-B in FIG. 8, to explain a production method of an optical window device according to a fourth specific embodiment of the present invention, and FIG. 8 is a schematic top view to explain a production method of an optical window device according to the fourth specific embodiment of the present invention.

In FIGS. 7 a)-d) and FIG. 8, reference numeral 1b designates a substrate, preferably a silicon substrate, reference numeral 2 a layer of a transparent material, preferably a glass or plastic layer, and reference numeral 3 an auxiliary layer, preferably a silicon layer. Reference numeral 4 designates a through hole opening in substrate 1b and reference numeral 5c designates a displaceable region which is a part of auxiliary layer 3, and is separated from remaining auxiliary layer 3 by a cavity 6. On one side of through hole opening 4 in substrate 1b a chamfer 22 is provided, and the parallel edge of the displaceable region 5c most proximate to it is characterized by reference numeral 23. Reference numeral 7 denotes an axis of inclination via which displaceable region 5c is able to be rotated into through hole opening 4. Displaceable region 5c shows an overlap 8 with the periphery of through hole opening 4. In an extreme case, the overlap may also be vanishingly small. The upper side of substrate 1b is characterized by reference numeral 10, and its lower side is characterized by reference numeral 11. The window pattern is characterized by F. Layer 2 is not depicted in FIG. 8 for reasons of clarity.

The specific embodiment is analogous to the first specific embodiment explained in FIGS. 1a)-d) and in FIG. 2, through hole opening 4 in substrate 1b being designed so that the stop of displaceable region 5c takes place with edge 23 on chamfer 22, which runs parallel to axis of inclination 7 and is the farthest removed from it (FIG. 7c)). According to FIG. 8, chamfer 22 is applied on only one side of through hole opening 4, the other three sides of through hole opening 4 also being able to be provided with slantwise or perpendicular edges. In order to implement the stop of displaceable region 5c and to set the maximum rotation of displaceable region 5c about axis of inclination 7, the distance of edge 23 from axis of inclination 7 is adjusted so that the rotation is blocked by chamfer 22 in response to an appropriate inclination (FIG. 7c)).

The third and fourth specific embodiments, which include limitation of the rotation of displaceable region 5b, 5c into through hole opening 4, is advantageous since, in the plastic deformation during the heating, the fusing of converted layer 2 with a contact surface is able to be prevented. Another advantage is that displaceable region 5b, 5c that has possibly been produced on a wafer several times, in each case has the same rotation after the plastic deformation, although the wafer has not been exposed to the same temperature at each place.

Figure 9A:
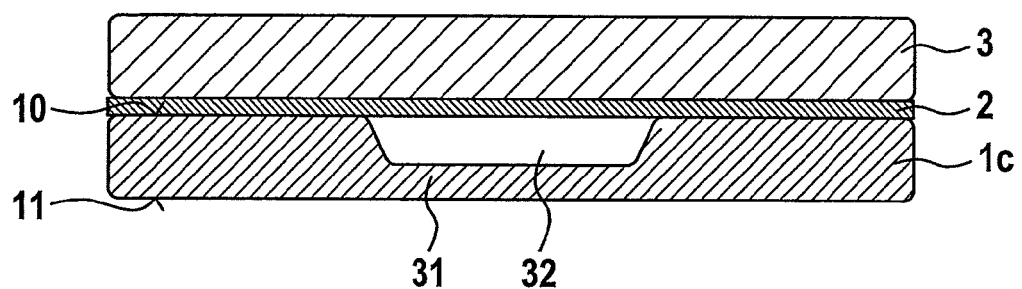
FIGS. 9*a*)-*d*) show schematic cross sectional views to explain a production method of an optical window device according the fifth specific embodiment of the present invention.

FIGS. 9a)-d) are schematic cross sectional views to explain a production method of an optical window device according to a fifth specific embodiment of the present invention.

In FIGS. 9a)-d), reference numeral 1c designates a substrate, preferably a silicon substrate, reference numeral 2 a layer of a transparent material, preferably a glass or plastic layer, and reference numeral 3 an auxiliary layer, preferably a silicon layer. In substrate 1c a cavity 32 has been inserted which, towards lower side 11, has a bottom region 31. Reference numeral 5 designates a displaceable region which is a part of auxiliary layer 3, and is separated from the remaining auxiliary layer 3 by a cavity 6. Reference numeral 7 denotes an axis of inclination via which displaceable region 5 is able to be rotated into cavity 32. Displaceable region 5 shows an overlap 8 with the periphery of cavity 32. In an extreme case, overlap 8 may also be vanishingly small. The upper side of substrate 1c is characterized by reference numeral 10. The window pattern is characterized by F.

Figure 9B:
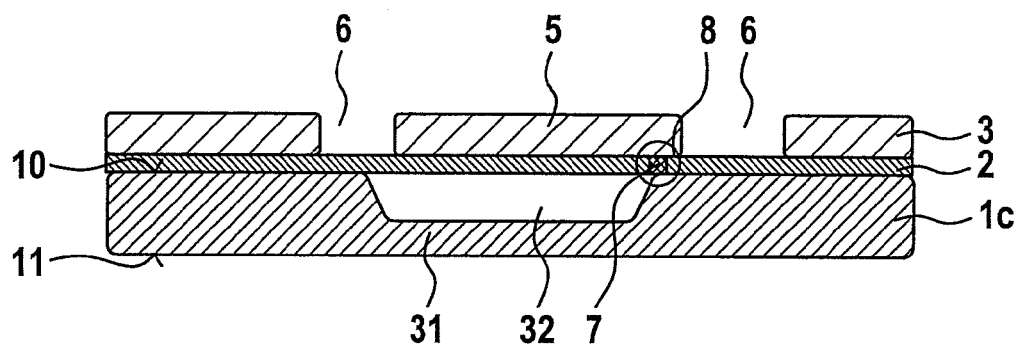
Figure 9C:
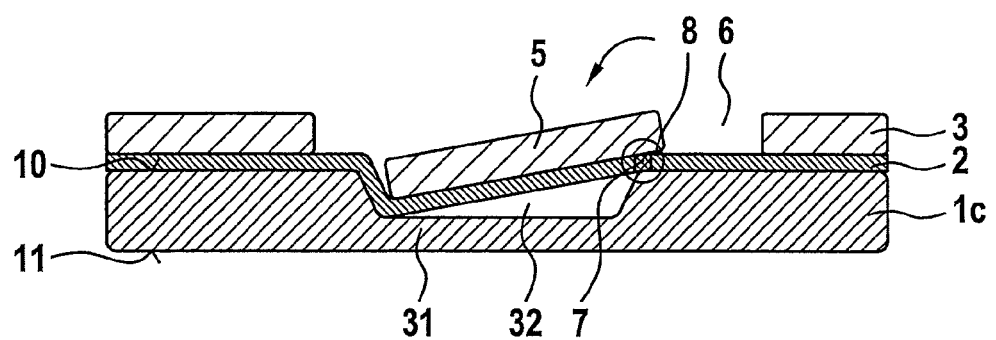
Figure 9D:
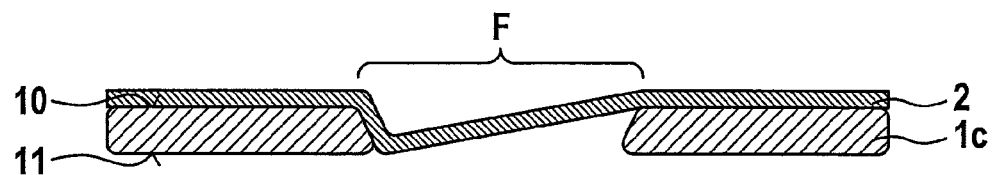

The sequence of the following production steps is not necessarily fixed, and may be undertaken in deviation from that. As shown in FIG. 9a), the insertion of a cavity 32 into substrate 1c), which is open towards upper side 10, takes place in a first step. In a second step, a composite is formed according to FIG. 9a) of a substrate 1c, a layer 2, which is to be made up of a transparent deformable material, and an auxiliary layer 3, there being a vacuum in cavity 32. In a third step, according to FIG. 9b), a displaceable region 5 is generated in auxiliary layer 3. In a fourth step, the overall composite is suitably heated, so that displaceable region 5, which demonstrates an overlap 8 with the periphery of cavity 32, is rotated on the one side into cavity 32 via axis of inclination 7 (FIG. 9c)). The plastic deformation takes place because of the vacuum, without requiring a planar suctioning of substrate 1c. According to FIG. 9d), in a fifth step, there takes place the exposing of layer 2 by the removing of auxiliary layer 3 and of floor region 31 in one etching process.

Figure 10A:
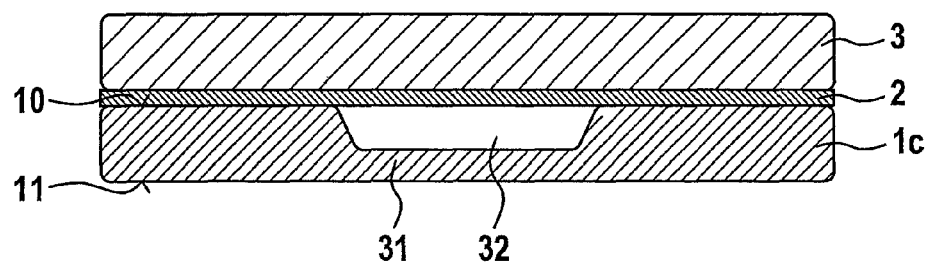
FIGS. 10*a*)-*d*) show schematic cross sectional views to explain a production method of an optical window device according the sixth specific embodiment of the present invention.

FIGS. 10a)-d) are schematic cross sectional views to explain a production method of an optical window device according to a sixth specific embodiment of the present invention.

In FIGS. 10a)-d), reference numeral 1c designates a substrate, preferably a silicon substrate, reference numeral 2 a layer of a transparent material, preferably a glass or plastic layer, and reference numeral 3 an auxiliary layer, preferably a silicon layer. In substrate 1c a cavity 32 has been inserted which, towards lower side 11, has a bottom region 31. Reference numeral 5a designates a displaceable region which is a part of auxiliary layer 3, and is connected to remaining auxiliary layer 3 via at least spring element 9. Reference numeral 6 denotes a cavity. Reference numeral 7 denotes an axis of inclination via which displaceable region 5a is able to be rotated into cavity 32. The upper side of substrate 1c is characterized by reference numeral 10. The window pattern is characterized by F.

Figure 10B:
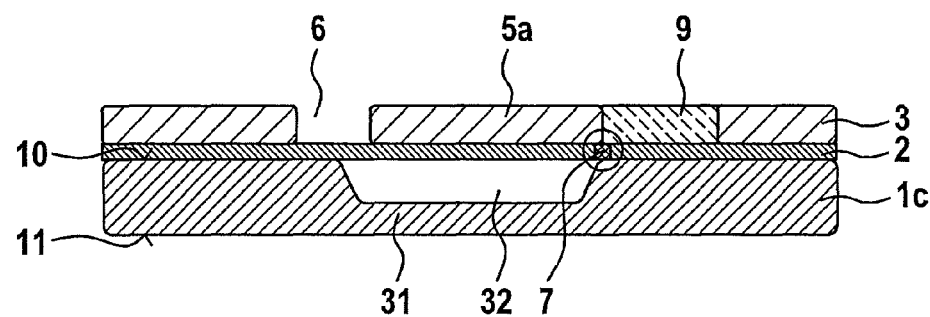
Figure 10C:
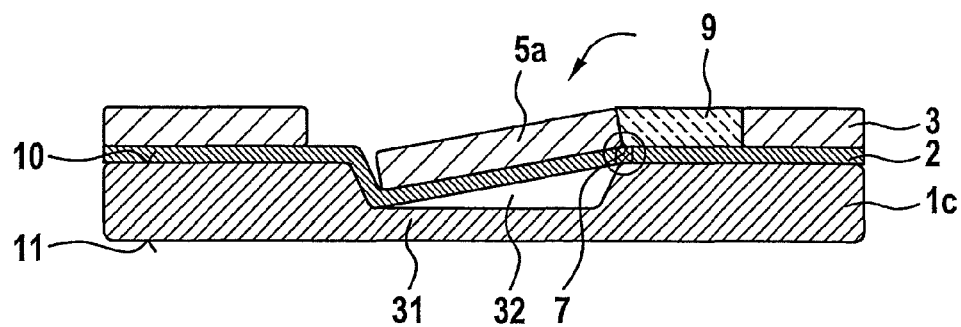
Figure 10D:
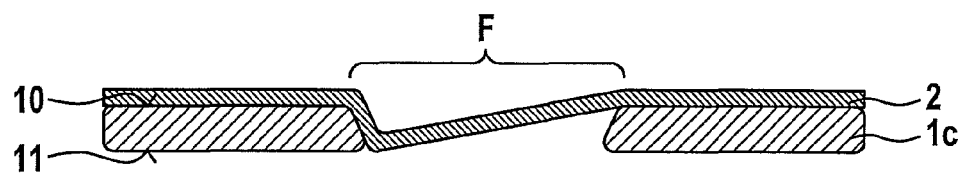

The specific embodiment is analogous to the fifth specific embodiment explained in FIGS. 9a)-d), the difference being that displaceable region 5a according to FIG. 10b)c) is connected to auxiliary layer 3 via at least one spring element 9, and demonstrates no overlap with the periphery of cavity 32.

The fifth and the sixth specific embodiment have the advantage that many wafers are able to be simultaneously processed in an oven (batch process for the slantwise positioning of the windows). These specific embodiments also have a stop for limiting the rotation of the displaceable region.

FIGS. 11 a)-d) are schematic cross sectional views to explain a production method of an optical window device according to a seventh specific embodiment of the present invention.

Figure 11A:
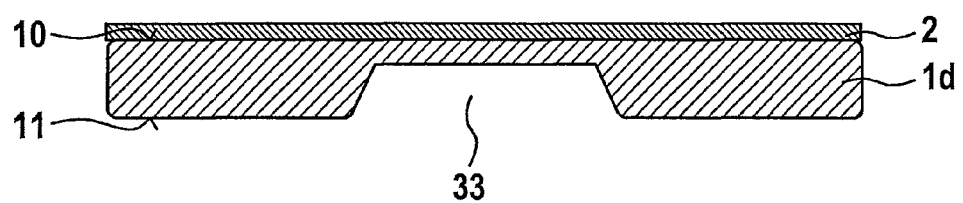
FIGS. 11*a*)-*d*) show schematic cross sectional views to explain a production method of an optical window device according the seventh specific embodiment of the present invention.
Figure 11B:
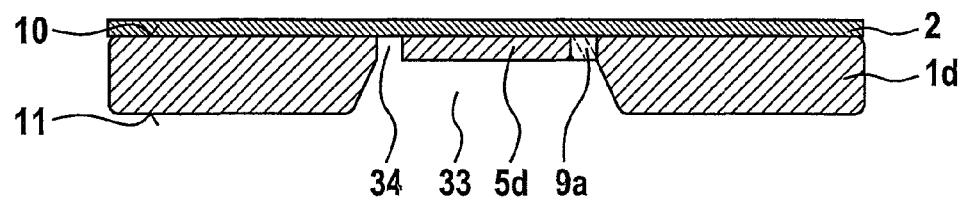
Figure 11C:
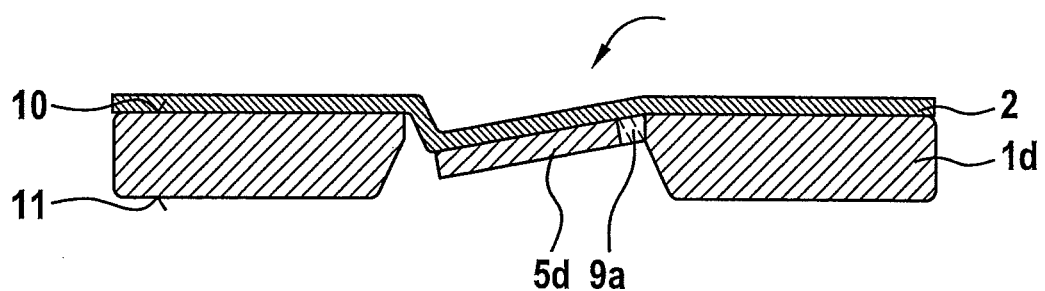
Figure 11D:
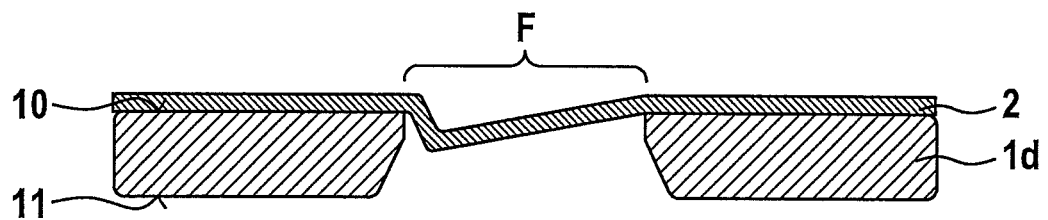

In FIGS. 11a)-d), reference numeral 1d designates a substrate, preferably a silicon substrate, reference numeral 2 a layer of a transparent material, preferably a glass or plastic layer. In substrate 1d a cavity 33 has been inserted which is open towards lower side 11. Reference numeral 5d denoted a displaceable region, which is connected to substrate 1d via at least one spring element 9a. Reference numeral 34 denotes a cavity. The upper side of substrate 1d is characterized by reference numeral 10. The window pattern is characterized by F.

The sequence of the following production steps is not necessarily fixed, and may be undertaken in deviation from that. According to FIG. 11a), the insertion of a cavity 33 into substrate 1d takes place with the aid of an etching process. In the second step, a composite is formed of substrate 1d and a layer 2, which is supposed to be made up of a transparent, thermally deformable material. According to FIG. 11b), in a third step, the generation of a displaceable region 5d in auxiliary layer 3 takes place and the application of at least one spring element 9a. In a fourth step there takes place a suitable heating of the overall composite, and the application of an underpressure from lower side 11 to cavity 33, so that displaceable region 5d is rotated on one side into cavity 33 (FIG. 11c)). Displaceable region 5d on the lower side of window pattern F, prevents the fusing of layer 2 with the suction surface, during the plastic deformation. In a fifth step, according to FIG. 11d), layer 2 is exposed by removing displaceable region 5d and torsion element 9a.

The optical window device produced is able to be connected to the MEMS or the MOEM wafers using bonding methods commonly applied in micromechanics, such as bonding using glass solder or adhesive, eutectic bonding or anodic bonding.

What is particularly advantageous in the specific embodiments explained is that window patterning F in substrates 1, 1a, 1b, 1c, 1d is sunk-in, and thereby protected. The window device should not be damaged during further processing, since scratches, marks and clinging particles are able to be avoided. This particularly applies when it comes to glass solder wafer bonding, in which the window device and the MOMEMS wafer are pressed against each other at high mechanical pressure.

Figure 12A:
FIGS. 12*a*)-*e*) show schematic cross sectional views to explain a production method of an optical window device according the eighth specific embodiment of the present invention.

FIGS. 12a)-d) are schematic cross sectional views to explain a production method of an optical window device according to an eighth specific embodiment of the present invention.

In FIGS. 12a)-e), reference symbol 1e designates a substrate, preferably a silicon substrate, reference numeral 2 a layer of a transparent material, preferably a glass or plastic layer. Reference symbols 1e1, 1e2, 1e3 and 1e4 designate clamping regions that are formed from substrate 1e, there being a recess 50 between the clamping regions. One edge of the clamping regions is characterized by reference symbols K1, K2, K3 and K4. The window pattern is characterized by F.

Figure 12B:
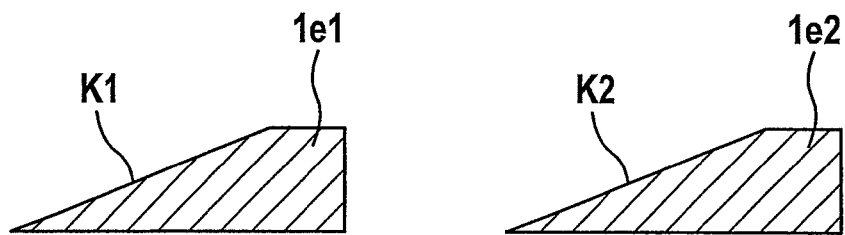

The sequence of the following production steps is not necessarily fixed, and may be undertaken in deviation from that. In a first step, there takes place according to FIG. 12b) the generation of at least four suitable clamping regions 1e1, 1e2, 1e3, 1e4 from a substrate 1e, which are provided with slanted surfaces by suitable patterning methods, such as by KOH etching, trench etching having the so-called ARDE effect (Aspect Ration Dependent Etching). The surfaces of these slanting areas are not of decisive meaning for the optical quality of window patterning F, in this instance.

Figure 12C:
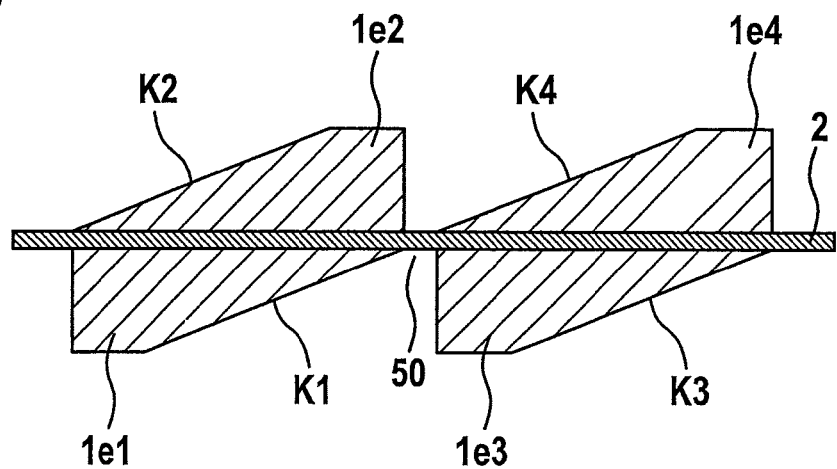

In a second step, according to FIG. 12c), the clamping regions are situated by pairs (1e1, 1e2), (1e3, 1e4) on both sides of a layer 2, which is made up of a thermally deformable transparent material, so that a recess 50 is formed.

In a third step, a composite is formed of the clamping regions 1e1, 1e2, 1e3, 1e4 and of layer 2, via anodic bonding or direct bonding, for example.

Elements 1e1, 1e2, 1e3 and 1e4 may also be produced as follows, in a first step in each case one substrate 1e being applied onto the front side and the backside of layer 2 using a usual bonding method, and in a second step edges K1, K2, K3, K4 as well as recess 50 are produced by looping.

Figure 12D:
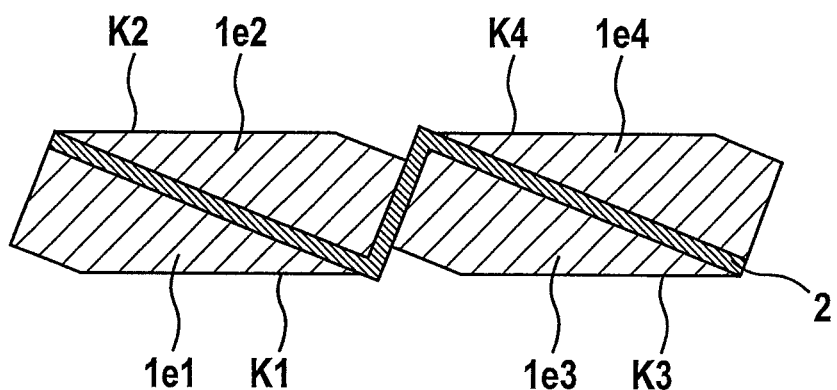

In a fourth step there takes place according to FIG. 12d) the transformation of layer 2, in that the composite is suitably heated and deformed using mechanical pressure on each side, so that the clamping regions arranged by pairs (1e1, 1e2) and (1e3, 1e4) are aligned to each other in such a way that, after the deforming, they are arranged flush next to each other in the same orientation, and the edges K1, K3 and K2, K4 of the clamping regions form a straight line on the two sides of layer 2. This process may be performed by a temperature-controlled and pressure-controlled bonder that is available in the trade. The stacking of a plurality of wafers, one on top of the other, is possible in this context (batch processing).

Figure 12E:
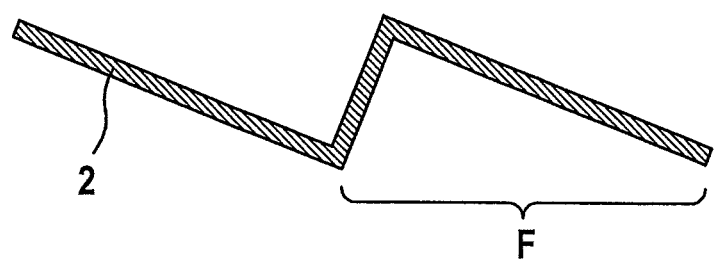

In a fifth step, according to FIG. 12e), window patterning F is exposed by removing substrate 1e, by etching it away.

Figure 13A:
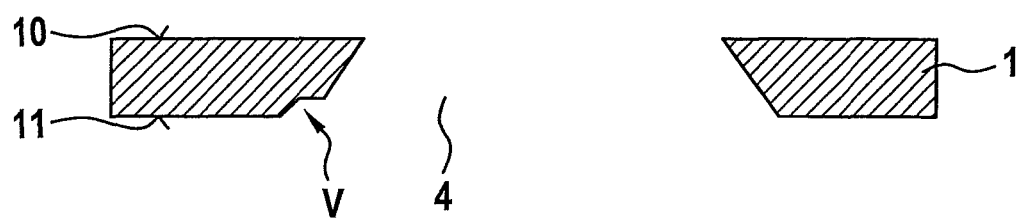
FIGS. 13*a*)-*f*) show schematic cross sectional views to explain a production method of an optical window device according the ninth specific embodiment of the present invention.

FIGS. 13a)-d) are schematic cross sectional views to explain a production method of an optical window device according to a ninth specific embodiment of the present invention.

In FIGS. 13a)-f), reference numeral 1 designates a substrate, preferably a silicon substrate, reference numeral 2 a layer of a transparent material, preferably a glass or plastic layer, and reference numeral 3 an auxiliary layer, preferably a silicon layer. Reference numeral 4 denotes a through hole opening in substrate 1 and reference numeral 5 denotes a displaceable region, which is part of auxiliary layer 3. Reference numeral 7 denotes an axis of inclination via which displaceable region 5 is able to be rotated into through hole opening 4. Displaceable region 5 shows an overlap 8 with the periphery of through hole opening 4. The upper side of substrate 1 is characterized by reference numeral 10, and its lower side is characterized by reference numeral 11. The window pattern is characterized by F. Reference symbol V denotes a recess in substrate 1.

Figure 13B:
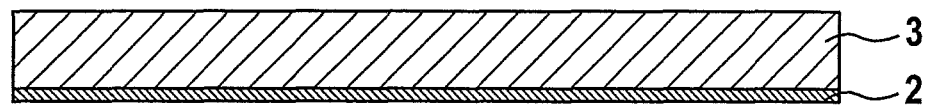
Figure 13C:
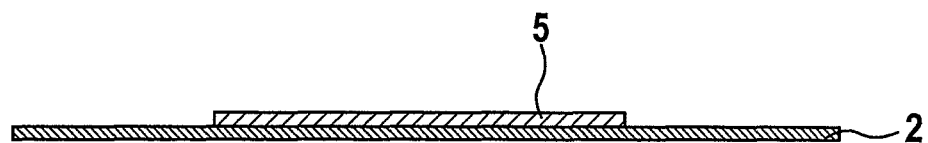
Figure 13D:
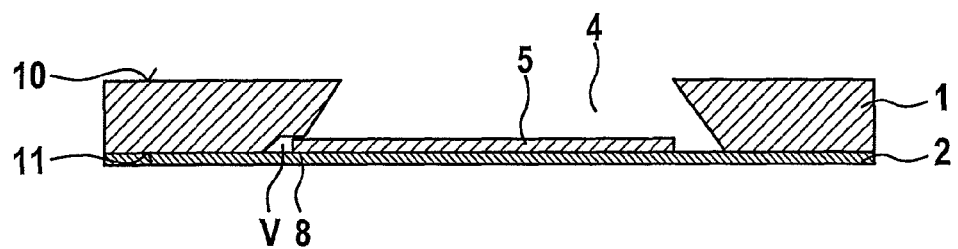
Figure 13E:
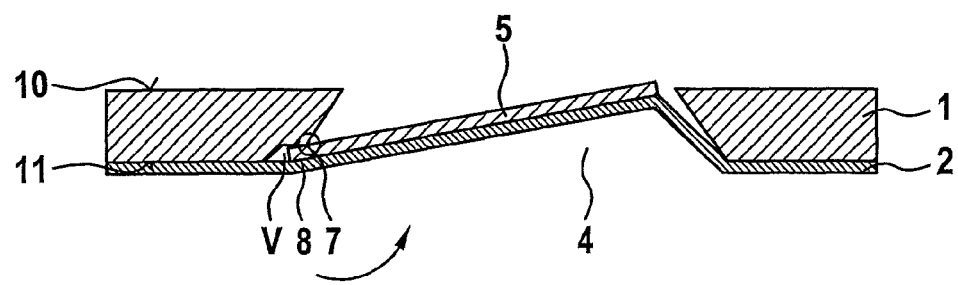
Figure 13F:
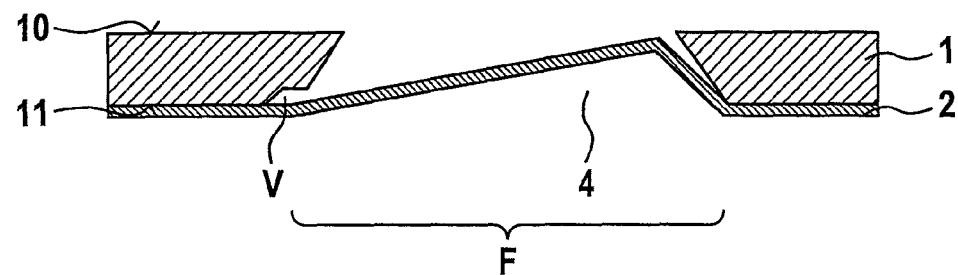

In a first step, according to FIG. 13a), there takes place the etching of through hole opening 4 into substrate 1 having the recess V. In a second step, according to FIG. 13b), there takes place the production of a wafer composite, made up of layer 2 and auxiliary layer 3, by anodic bonding, for example. In a third step, according to FIG. 13c), a displaceable region 5 is generated from auxiliary layer 3, for instance, by thinning auxiliary layer 3 and subsequently applying a DRIE process. In a fourth step, according to FIG. 13d), there takes place the joining of the composite, made up of displaceable region 5 of auxiliary layer 3, layer 2 and substrate 1. In a fifth step, according to FIG. 13e), there takes place a rotating of displaceable region 5 about axis of inclination 7 in recess V of substrate 1. In a sixth step, according to FIG. 13f), displaceable region 5 of auxiliary layer 3 is etched away, so that window patterning F is exposed.

Although the present invention has been described with the aid of preferred exemplary embodiments, it is not limited to these. The mentioned materials and topologies in particular have merely exemplary character and are not restricted to the examples explained.

One process option of the specific embodiments described is the generation of a nanopatterned surface of layer 2 in the vicinity of window patterning F to reduce the undesired reflections. To do this, the material lying against layer 2, is provided with nanopatterning on the side directed towards layer 2, even before the material is connected to layer 2. This is done using KOH etching or trench etching, for example.

The nanopatterning of layer 2 takes place during the plastic deformation. After the plastic deformation, the corresponding material is etched away from window patterning F.

What is claimed is:

1. A method for producing an optical window device for a MEMS device, comprising:
   applying a layer of a transparent material onto a substrate having a recess; and
   deforming the transparent material layer so that the layer is bent into the recess and a deformed area of the layer forms an optical window;
   wherein an auxiliary layer is generated only on a single side of the transparent material layer, the auxiliary layer having a displaceable region which, during the deformation of the transparent material layer, is rotated into the recess about an axis of inclination and which is removed after the deforming of the transparent material layer.

2. The method as recited in claim 1, wherein the auxiliary layer is generated only on a side of the transparent material layer facing away from the substrate.

3. The method as recited in claim 2, wherein the displaceable region has an overlap with a periphery of the recess.

4. The method as recited in claim 2, wherein the displaceable region is connected to another region of the auxiliary layer via at least one spring element.

5. A method for producing an optical window device for a MEMS device, comprising:
   applying a layer of a transparent material onto a substrate having a recess; and
   deforming the transparent material layer so that the layer is bent and a deformed area of the layer forms an optical window;
   wherein, on a side of the transparent material layer facing away from the substrate, an auxiliary layer is generated, which has a displaceable region which, during the deformation, is rotated into the recess about an axis of inclination and which is removed after the deforming, the displaceable region having an overlap with a periphery of the recess; and
   wherein the recess is a through hole opening, and wherein the displaceable region has at least one stop element and corresponding sides of the substrate having a chamfer in the through hole opening which establishes the maximum rotation of the displaceable region into the through hole opening about the axis of inclination.

6. The method as recited in claim 1, wherein the recess is a through hole opening, and wherein the substrate has a chamfer in the through hole opening, which establishes a maximum rotation of the displaceable region into the through hole opening about the axis of inclination.

7. The method as recited in claim 1, wherein the recess has a bottom region which is removed after the deformation.

8. The method as recited in claim 1, wherein the auxiliary layer is generated only on a side of the transparent material layer facing the substrate, and wherein the displaceable region is connected to the remainder of the substrate via at least one spring element, the displaceable region and the spring element being removed after the deformation.

9. A method for producing an optical window device for a MEMS device, comprising:
   applying a layer of a transparent material onto a substrate having a recess; and
   deforming the transparent material layer so that the layer is bent and a deformed area of the layer forms an optical window;
   wherein the substrate has at least two pairs of clamping regions lying opposite to one another between which the layer is clamped in, the two pairs being separated from each other by the recess, and the deforming takes place in such a way that the two pairs are displaced with respect to each other, the substrate being removed after the deforming.

10. The method as recited in claim 1, wherein at least one side of the transparent material layer has a nanopatterned surface.

* * * * *